(12) United States Patent
Tao

(10) Patent No.: US 11,387,812 B2
(45) Date of Patent: Jul. 12, 2022

(54) DRIVE CIRCUIT OF ELECTRONIC-SWITCH SERIES STRUCTURE

(71) Applicant: Shunzhu Tao, Tangshan (CN)

(72) Inventor: Shunzhu Tao, Tangshan (CN)

( * ) Notice: Subject to any disclaimer, the term of this patent is extended or adjusted under 35 U.S.C. 154(b) by 0 days.

(21) Appl. No.: 16/652,994

(22) PCT Filed: Sep. 19, 2018

(86) PCT No.: PCT/CN2018/106483
§ 371 (c)(1),
(2) Date: Apr. 8, 2020

(87) PCT Pub. No.: WO2019/153749
PCT Pub. Date: Aug. 15, 2019

(65) Prior Publication Data
US 2021/0159889 A1 May 27, 2021

(30) Foreign Application Priority Data

Feb. 11, 2018 (CN) .......................... 201810140647.2

(51) Int. Cl.
*H03K 3/012* (2006.01)
*H03K 17/567* (2006.01)

(52) U.S. Cl.
CPC .......... *H03K 3/012* (2013.01); *H03K 17/567* (2013.01)

(58) Field of Classification Search
None
See application file for complete search history.

(56) References Cited

U.S. PATENT DOCUMENTS

| 5,148,064 A * | 9/1992 | Kevorkian ........... H03K 17/102 327/427 |
| 9,595,950 B1 * | 3/2017 | Seok ................ H03K 17/08122 |
| 10,116,300 B2 * | 10/2018 | Hernandez Blasco ..................... H05B 6/1236 |
| 10,243,551 B1 * | 3/2019 | Tran ....................... H02H 3/202 |

* cited by examiner

*Primary Examiner* — Jeffery S Zweizig

(57) ABSTRACT

This invention relates to a driving circuit with electronic switches in serial connection structure, and this driving circuit includes: electronic switch module and active drive module, electronic switch module includes: n pcs electronic switches in serial connection, and n pcs electronic switches D and S terminal connected in series in turn; active drive modules includes: n pcs active drive circuits; and in this invention, the power supply and the driving pulse signal of the electronic switch K2 to Kn are obtained successively from electronic switch K1, and the electronic switch K1 to Kn is on and off in turn; The n pcs electronic switches have nanosecond level of the switching performance of the active circuit, which are suitable for the high frequency high power gate drive circuit when n pcs electronic switches series structure is used.

7 Claims, 5 Drawing Sheets

DRIVE CIRCUIT OF ELECTRONIC-SWITCH SERIES STRUCTURE

TECHNOLOGY FIELD

This invention belongs to the power electronics technology field, which involves in the driving circuit with electronic switches in serial connection structure.

BACKGROUND TECHNOLOGY

In the electronic switching circuit, for the drive circuit with IGBT tube as the electronic switch, the breakdown voltage of DS electrode from single tube IGBT cannot meet the pressure requirement of the working voltage, so it needs to be used in tandem with IGBT, each IGBT active drive circuit adopts the circuit structure of the fiber, transformer or resistive bus voltage conversion and stabilization; it can be understood that there are three kinds of electron coupling for optical coupling, magnetic coupling and voltage level conversion.

Among them: electron coupling has the characteristic of simple, reliable, high-speed.

The electronic coupling realization of n IGBT serial driving, as shown in FIG. 1, the working principle of 2 IGBT or MOS in series is described. Bus voltage is stepped down by R1 and R2 in serial connection and stabilized by Zener diode DW, the switching activity of DS terminal of K1 act as K2 driving pulse signal and the power source of the driving circuit; The driving mode of K2 belongs to passive driving mode. Because of K2 driving current is limited by bus voltage divider resistor R1 and R2, the energy of driving pulse is weak, resulting in a decline of K2 driving pulse leading edge and trailing edge in microseconds level; This rise and fall time relates to the linear switching loss of K2; K2 has a large switching loss, low switching efficiency and poor reliability. At the same time, the voltage divider R1 and R2 of the bus voltage also produce passive loss.

INVENTION CONTENT

In order to solve the above technical problems, the present invention provides a simple, high efficiency, high speed IGBT or MOS electronic switches in serial connection structure driving circuit.

In order to achieve the above objectives, the technical scheme of the present invention is as follows:

An electronic switch in serial connection structure driving circuit, including: electronic switch module and active drive module[[,]];

Electronic switch module includes: electronic switch K1 to electronic switch Kn, and n DS of electronic switch hitch in series connection, in turn, the first n electronic switch Kn S terminal connects with n−1 electronic switch Kn−1 D terminal, including: n≥2, n is an integer;

Active driver module includes: Dr1 to Drn active drive circuit, filter capacitor C1 to Cn, current limiting element R12 to R1n, voltage conversion isolation diodes D12 to D1n and drive signal isolation diode D22 to D2n, active drive circuit drives the corresponding electronic switch;

The input terminal of the active drive circuit connected with the electronic switch K1 is connected to the pulse generator;

The power supply terminal of the active drive circuit Dr1 is connected with the Vcc power supply;

The ground terminal of the active drive circuit Dr1 is connected with Vcc ground, the filter capacitor C1 and the S terminal electronic switch K1;

The output of the active drive circuit Dr1 is connected with the G terminal of the electronic switch K1;

The D terminal of the electronic switch K1 is connected with the S terminal of the electronic switch K2;

The input terminal of the active drive circuit connected with the electronic switch Kn is connected with the Vcc power supply end through the drive signal isolation diode D2n.

The power supply terminal of the active drive circuit Drn is connected with the VCC through the current limiting element R1n and voltage conversion isolation diode D1n, and the power supply terminal of the active drive circuit Drn is also connected with the filter capacitor Cn.

The ground terminal of the active drive circuit Drn are connected with the filter capacitor Cn, the S terminal of the electronic switch Kn and the D terminal of the electronic switch kn−1.

The output terminal of the active drive circuit Drn is connected with the G terminal of the electronic switch Kn;

From the electronic switch K2 to the electronic switch Kn, the electrical energy and the driving pulse of the electronic switch K1 are obtained successively. The electronic switch K1 to the electronic switch Kn is on and off in turn.

The invention provides a simple, efficient, high speed electronic switches in serial connection structure driving circuit. It has the following beneficial effects:

1) The circuit structure is simple, one set of power supply;

2) The electronic switch Kn also obtains the same voltage and isolated power as the electronic switch K1, works in active drive mode. has ns level switching performance, and its driving mode is the most efficient.

On the basis of the above technical scheme, the following improvements can be made:

As a preferred option, the electronic switch is IGBT tube, MOS transistor or any electronic switching device.

The above optimization scheme is suitable for low frequency as well as high frequency drive mode.

As an optimal scheme, the on pulse and the off pulse of the electronic switch K1 and the drive pulse output by pulse generator have identical frequency and phase.

As a preferred option, the on pulse and the off pulse of the electronic switch Kn and the drive pulse output by pulse generator have identical frequency and phase.

As a preferred option, the active drive circuit Drn is connected to the electronic switch Kn:

The positive electrode of the drive signal isolation diode D2n is connected with the Vcc power supply terminal, and its negative electrode is connected with the input terminal of the active drive circuit Drn.

The positive electrode of the voltage conversion isolation diode D1n is connected to the Vcc power supply terminal, and its negative electrode is connected with the power terminal of the active drive circuit Drn through the current-limiting resistor R1n.

Adopting the above optimization scheme, the structure is simple.

As a preferred option, the active drive circuit is connected to the electronic switch Kn:

The positive electrode of the driving signal isolation diode D2n is connected with the Vcc power supply terminal, and its negative terminal is connected with the input terminal of the active drive circuit Drn and the positive electrode of the voltage conversion isolation diode D1n respectively.

The negative electrode of the potential conversion isolation diode D1n is connected to the power terminal of the active drive circuit Drn through the current-limiting element R1n.

Adopting the above optimization scheme, the structure is simple.

As an optimized scheme, within the active drive circuit Dr2 connected with the electronic switch K2:

The positive electrode of the driving signal isolation diode D22 is connected to the Vcc power supply terminal, and its negative electrode is connected with the input terminal of the active drive circuit Dr2 and the positive electrode of the voltage conversion isolation diode D12 respectively.

The negative terminal of the voltage conversion isolation diode D12 is connected to the power supply terminal of the active drive circuit Dr2 through current-limiting element R12.

Within the active drive circuit Drn connected with electronic switch Kn:

The positive electrode of the drive signal isolation diode D2n is connected to the Vcc power supply terminal, and its negative terminal is connected with the input terminal 1 of the active drive circuit Drn.

The positive electrode of the voltage conversion isolation diode D1n is connected to the Vcc power supply terminal, and its negative electrode is connected with the power supply terminal 3 of the active drive circuit Drn through the current-limiting resistor R1n.

Adopting the above optimization scheme, the structure is simple.

As an optimized scheme, within the active drive circuit Dr2 connected with the electronic switch K2.

The positive electrode of the driving signal isolation diode D22 is connected to the Vcc power supply terminal, and its negative electrode is connected with the input terminal of Dr2 and the positive electrode of potential conversion isolation diode D12 respectively.

The negative electrode of the potential conversion isolation diode D12 is connected to the power supply terminal of the active drive circuit Dr2 through the current limiting element R12;

Within the active drive circuit Drn connected with electronic switch Kn:

The positive electrode of the drive signal isolation diode D2n is connected with the input terminal of the active drive circuit Drn−1, the positive electrode of the voltage conversion isolation diode D1n−1 and the negative electrode of the driving signal isolation diode D2n−1 respectively;

The negative electrode of the driving signal isolation diode D2n is connected with the input terminal of the active drive circuit Drn, and the positive electrode of the voltage conversion isolation diode D1n respectively.

The negative electrode of the voltage conversion isolation diode D1n is connected to the power terminal of the active drive circuit Drn through the current-limiting element R1n.

Wherein: 1 input terminal, 2 output terminal, 3 power supply terminal, 4 ground terminal

DETAILED DESCRIPTION

The following is a detailed description of the preferred embodiment of this invention.

Figure 1:
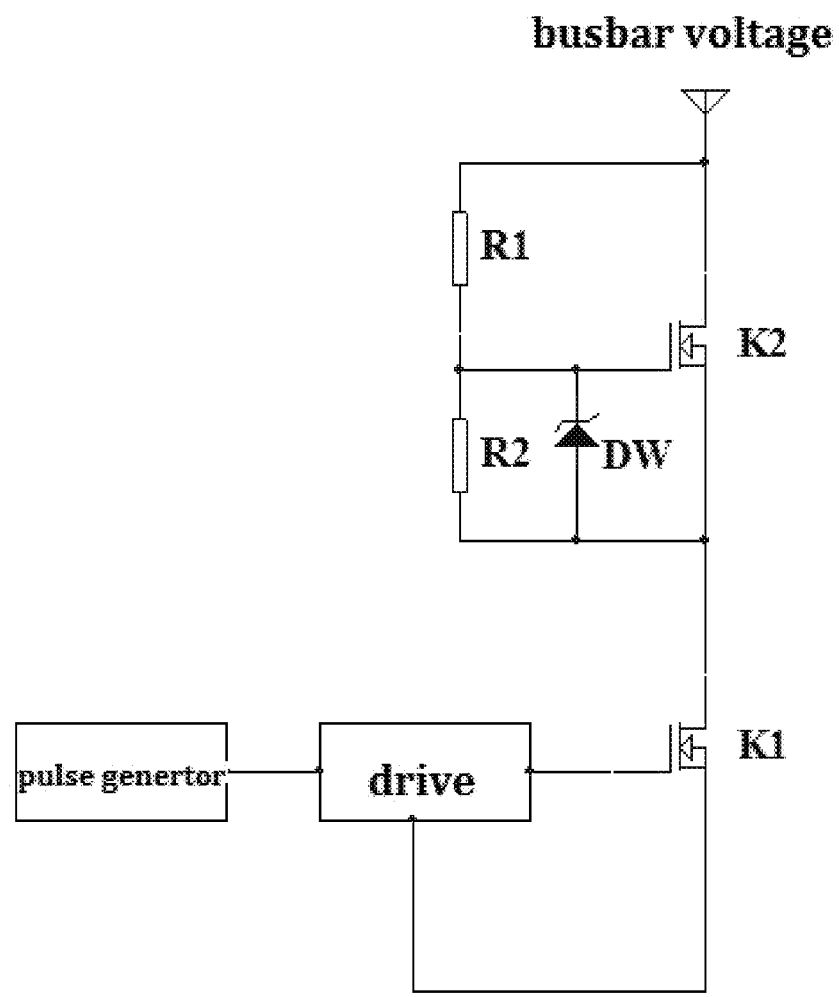
FIG. 1 shows the circuit diagram of the driving circuit of electronic switches in serial connection structure in existing technology
Figure 2:
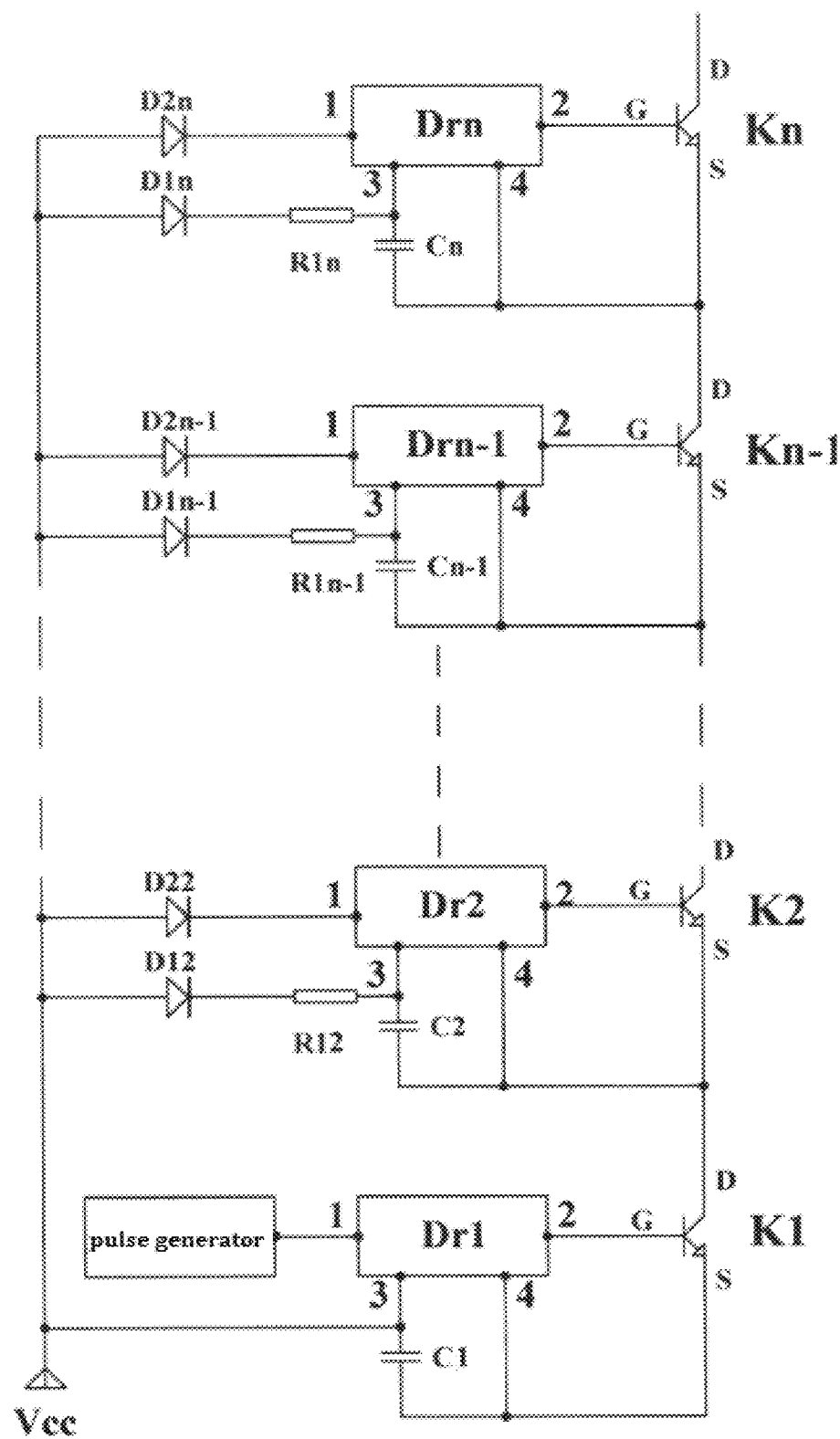
FIG. 2 shows the circuit diagram 1 of a kind of driving circuit with electronic switches in serial connection structure which is provided for the embodiment of this invention.

In order to achieve the purpose of this invention, a kind of driving circuit with electronic switches in serial connection structure and active driver module of some of the implementation of the case, as shown in FIG. 2, a kind of driving circuit with electronic switches in serial connection structure, including: electronic switch module and active drive module, Electronic switch module includes: electronic switch K1 to Kn and N electronic switch DS terminal in series connection, S terminal of the nth. electronic switch Kn connect to D terminal of n−1 electronic switch Kn−1, where: n≥2, n is an integer;

Active driver module includes: active drive circuit Dr1 to Drn, filter capacitor C1 to Cn, current limiting element R12 to R1n, voltage conversion isolation diodes D12 to D1n and drive signal isolation diode D22 to D2n, active drive circuit drives the corresponding electronic switch;

The input terminal 1 of the active drive circuit Dr1 connected with the electronic switch K1 is connected to the pulse generator;

The power supply terminal 3 of the active drive circuit Dr1 is connected with the Vcc power supply terminal;

The ground terminal 4 of the active drive circuit Dr1 is connected with the Vcc ground terminal, the filter capacitor C1 and S terminal of the electronic switch K1 respectively;

The output terminal 2 of the active drive circuit Dr1 is connected with the G terminal of the electronic switch K1;

The D terminal of the electronic switch K1 is connected with the S terminal of the electronic switch K2;

The input terminal 1 of the active drive circuit Drn connected with the electronic switch Kn is connected with the Vcc power supply terminal through the drive signal isolation diode D2n.

The power supply terminal 3 of the active drive circuit Drn is connected with the VCC power supply terminal through the current limiting element R1n and voltage conversion isolation diode D1n, and the power supply terminal 3 of the active drive circuit Drn is also connected with the filter capacitor Cn.

The ground terminal 4 of the active drive circuit Drn are connected with the filter capacitor Cn, the S terminal of the electronic switch Kn and the D terminal of the electronic switch Kn−1.

The output terminal 2 of the active drive circuit Drn is connected with the G terminal of the electronic switch Kn;

From the electronic switch K2 to Kn, the electrical energy and the driving pulse of the electronic switch K1 are obtained successively. The electronic switch K1 to the electronic switch Kn is on and off in turn.

Within the active drive circuit Drn connected with electronic switch Kn:

The positive electrode of the drive signal isolation diode D2n is connected to the Vcc power supply terminal, and its negative terminal is connected with the input terminal 1 of the active drive circuit Drn.

The positive electrode of the voltage conversion isolation diode D1n is connected to the Vcc power supply terminal, and its negative electrode is connected with the power supply terminal 3 of the active drive circuit Drn through the current-limiting resistor R1n.

In this embodiment, the electronic switch is IGBT, and the current-limiting element is current-limiting resistor.

The operating principle of the driving circuit with electronic switch series structure is as follows:

The on pulse output by the pulse generator, is connected to the drive signal input terminal 1 of the active drive circuit Dr1, the output terminal 2 of the active drive circuit Dr1 is connected to the G terminal of electronic switch K1, electronic switch K1 is on; DS terminal of electronic switch K1 short circuit;

VCC power supply terminal provides power through the voltage conversion isolation diode D12 to an active drive circuit Dr2 power terminal 3 with the electronic switch K2. The ground terminal 4 of Dr2 is connected with S terminal of the electronic switch K2, the S terminal of the electronic switch K2 is connected with D terminal of the electronic switch K1·C2 is the filter capacitor between the supply terminal 3 active drive circuit Dr2 and the ground terminal 4. Since the DS terminal of the electronic switch K1 is short, the stable voltage at both terminal of the filter capacitor C2 is provided to the power supply terminal 3 and the ground terminal 4 of the active drive circuit Dr2.

VCC power supply terminal is connected with the driver signal input terminal 1 of the active drive circuit Dr2 through the drive signal isolation diode D22. Because DS terminal of the electronic switch K1 is short-circuited to the ground. The input terminal of active drive circuit Dr2 establish on pulse same as the pulse during DS short circuit of electronic switch K1. The output terminal 2 of active drive circuit Dr2 is connected with the G terminal of the electronic switch K2, and the electronic switch K2 DS terminal short circuit.

VCC power supply terminal provides power through the voltage conversion isolation diode D1n to an active drive circuit Drn power terminal 3 with the electronic switch Kn. The ground terminal 4 of Drn is connected with S terminal of the electronic switch Kn, the S terminal of the electronic switch Kn is connected with D terminal of the electronic switch Kn−1·Cn is the filter capacitor between the supply terminal 3 active drive circuit Drn and the ground terminal 4. Since the DS terminal of the electronic switch K1 to Kn−1 is short, the stable voltage at both terminal of the filter capacitor Cn is provided to the power supply terminal 3 and the ground terminal 4 of the active drive circuit Drn.

VCC power supply terminal is connected with the driver signal input terminal 1 of the active drive circuit Drn through the drive signal isolation diode D2n. Because DS terminal of the electronic switch K1 to Kn−1 is short-circuited to the ground. The input terminal of active drive circuit Dr2 establish on pulse same as the pulse during DS short circuit of electronic switch K1. The output terminal 2 of active drive circuit Drn is connected with the G terminal of the electronic switch Kn, and the electronic switch Kn DS terminal short circuit. the DS terminal of the electronic switch K1 to Kn all short circuit.

The off pulse output by the pulse generator, is connected to the drive signal input terminal 1 of the active drive circuit Dr1, the output terminal 2 of the active drive circuit Dr1 is connected to the G terminal of electronic switch K1, electronic switch K1 is off; DS terminal of electronic switch K1 open circuit;

The negative electrode of drive signal isolates diode D22 output off pulse to the input terminal of the active drive circuit Dr2. The output terminal 2 of the active drive circuit Dr2 outputs off signal to the G terminal of the electronic switch K2, the DS terminal of the electronic switch K2 is open circuit.

Because of the DS terminal of the electronic switch K1 to Kn−1 all open circuit, the active drive circuit D2n negative electrode output off pulse to the active drive circuit Drn input 1, active drive circuit output terminal 2 output off signal to terminal G of electronic switch Kn, electronic switch Kn DS terminal open circuit; Electronic switch K1 to electronic switch Kn DS terminal are all open.

Electronic switch K1 to electronic switch Kn are serial connected in turn, the D terminal of the electrode switch Kn and the S terminal of the electronic switch K1 are equivalent to the DS terminal of one high-voltage electronic switch. The G terminal of the electronic switch K1 is equivalent to the G terminal of the high-voltage electronic switch.

This invention relates to a kind of driving circuit with electronic switch series structure, and the N pcs DS terminal of electronic switches is in series.

From the electronic switch K2 to Kn, the electrical energy and the driving pulse of the electronic switch K1 are obtained successively, and the electronic switch K1 to Kn is on and off in turn; N electronic switch had all active drive circuit nanosecond level switching performance, suitable for n electronic switches in serial connection structure when using low frequency and high frequency power drive circuit, suitable for IGBT drive circuit used for multi-stage electronic switches in serial connection structure, high voltage DC/DC converter and high voltage switch power supply.

This invention provides a kind of simple, efficient, high speed driving circuit with electronic switches in serial connection structure. It has the following beneficial effects:

1) The circuit structure is simple only includes one set of power supply;

2) The electronic switch Kn also obtains the same power as the electronic switch K1, and the electrical energy is isolated. It works under active drive state, has ns level switching performance, and its driving mode is the most efficient.

Figure 3:
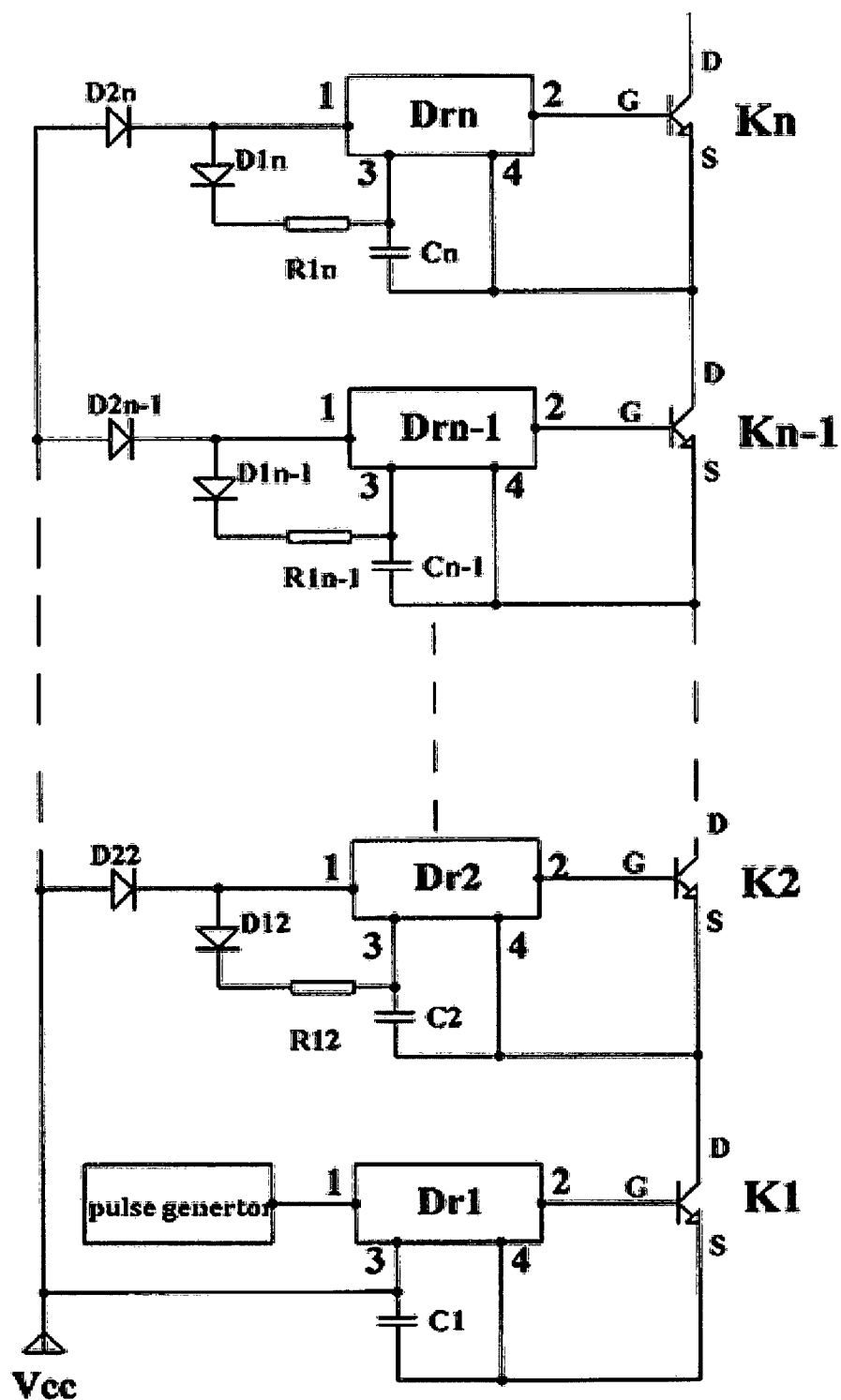
FIG. 3 shows the circuit diagram 2 of a kind of driving circuit with electronic switches in serial connection structure which is provided for the embodiment of this invention.

As shown in FIG. 3, in order to further optimize the effect of this invention, in other embodiments, the rest characteristics of the technology is same, the difference is that the active drive circuit Drn, which is connected with electronic switch Kn:

The positive electrode of the driving signal isolation diode D2n is connected with the Vcc power supply terminal, and its negative electrode is connected with the input terminal 1 of the active drive circuit Drn, and the positive electrode of the voltage conversion isolation diode D1n respectively.

The negative electrode of the potential conversion isolation diode D1n is connected with the power supply terminal 3 of the active drive circuit Drn through the limiting element R1n.

Adopting the above optimization scheme, the structure is simple.

Figure 4:
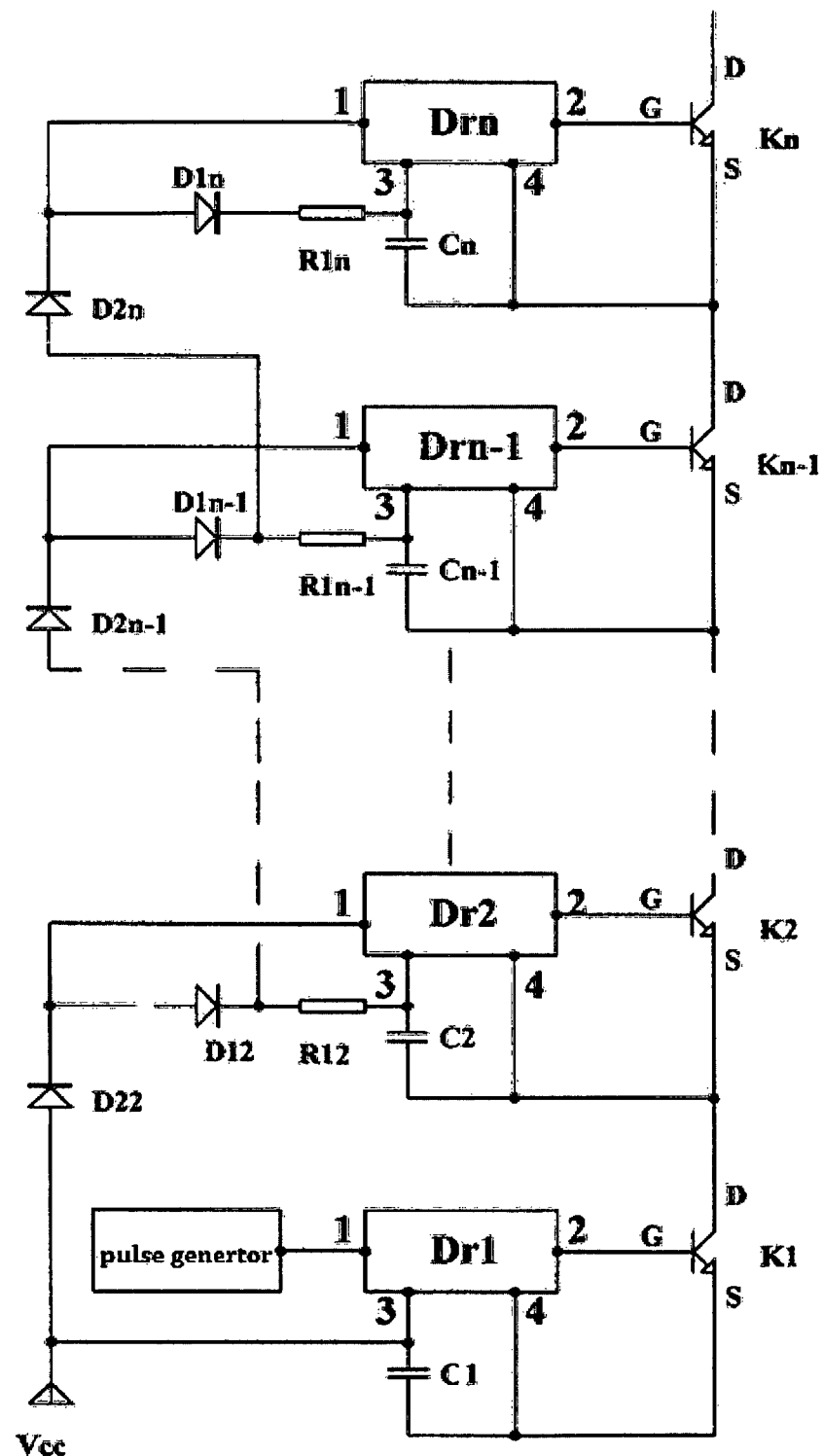
FIG. 4 shows the circuit diagram 3 of a kind of driving circuit with electronic switches in serial connection structure which is provided for the embodiment of this invention.

As shown in FIG. 4, in order to further optimize the effect of the invention, in some other embodiments, the rest of characteristics of the technology is same, the difference is the active drive circuit Dr2, which is connected with electronic switch K2:

The positive electrode of the driving signal isolation diode D22 is connected to the Vcc power supply terminal, and its negative electrode is connected to the input terminal 1 of the active drive circuit Dr2 and the positive electrode of the voltage conversion isolation diode D12.

The negative electrode of the voltage transfer isolation diode D12 is connected with the power supply terminal 3 of the active drive circuit Dr2 through the current-limiting element R12.

Within the active drive circuit Drn connecting with electronic switch Kn:

The positive electrode of the driving signal isolation diode D2n is connected with the negative electrode of the potential conversion diode Din-1, and the positive electrode is also connected with the current-limiting element R1n-1. The negative electrode of the driving signal isolation diode D2n is connected with the input terminal 1 of the active drive circuit Drn and positive electrode of the potential conversion isolation diode D1n.

The negative electrode of the voltage conversion isolation diode D1n is connected with the power supply terminal 3 of the active drive circuit Drn through the limiting element R1n.

Adopting the above optimization scheme, the structure is simple.

Figure 5:
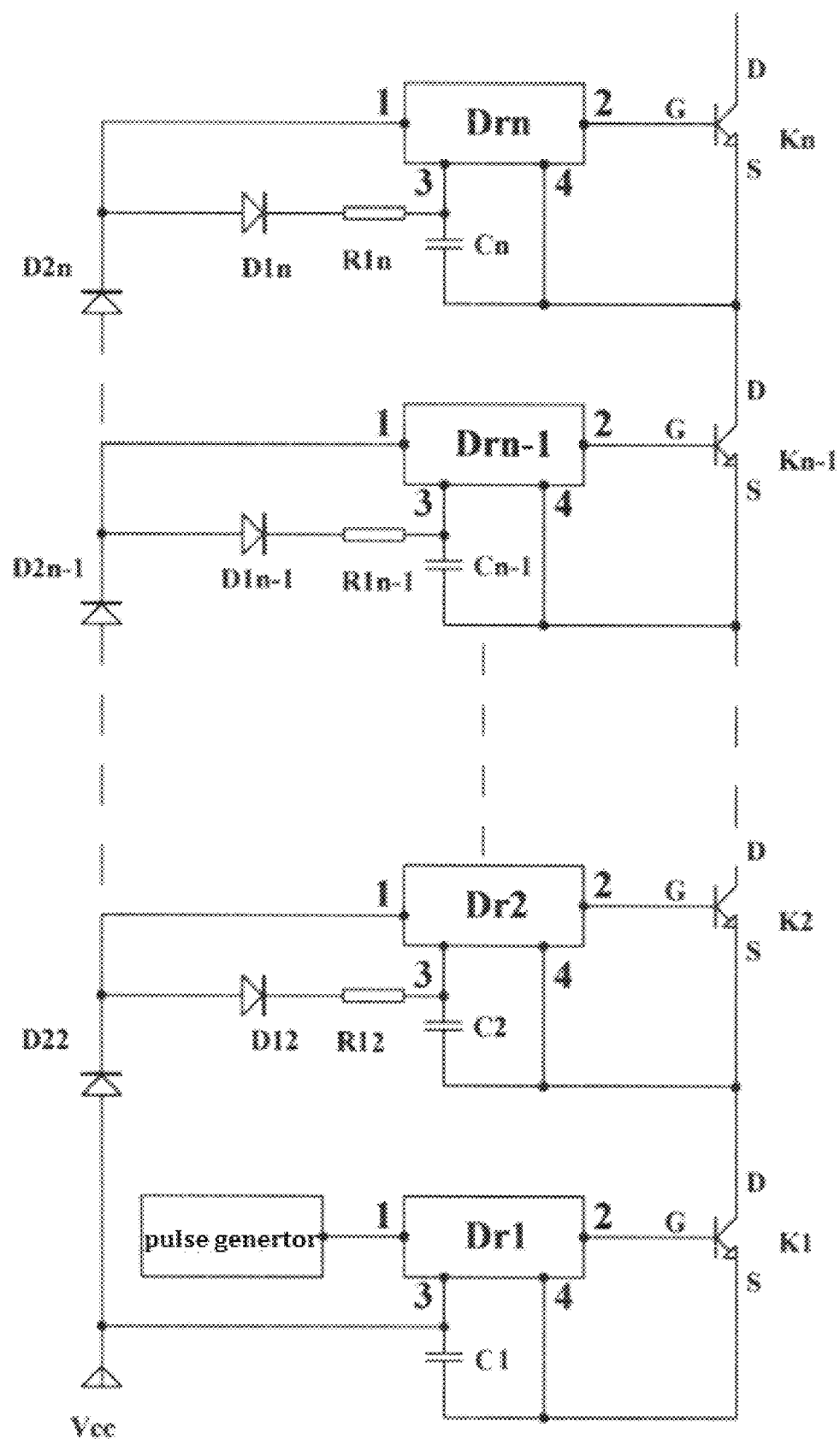
FIG. 5 shows the circuit diagram 4 of a kind of driving circuit with electronic switches in serial connection structure which is provided for the embodiment of this invention.

As shown in FIG. 5, in order to further optimize the effect of this invention, in some other embodiments, the rest characteristics of the technology is same, the difference is the active drive circuit Dr2, which is connected with electronic switch K2.

The positive electrode of the driving signal isolation diode D22 is connected to the Vcc power supply terminal and the negative electrode is connected with the input terminal 1 of Dr2 and the positive electrode of the potential conversion isolation diode D12 respectively.

The negative electrode of voltage conversion isolation diode D12 is connected with the power supply terminal 3 of the active drive circuit Dr2 through the current-limiting element R12.

Within the active drive circuit Drn connecting with electronic switch Kn:

The positive electrode of the driving signal isolation diode D2n is connected with the input terminal 1 of the active drive circuit Drn-1 and the positive electrode of the potential conversion isolation diode D1n-1 and the negative electrode of the driving signal isolation diode D2n-1 respectively.

The negative electrode of the driving signal isolation diode D2n is connected with the input terminal 1 of the active drive circuit Drn, and the positive electrode of potential conversion isolation diode D1n respectively.

The negative electrode of the potential conversion isolation diode D1n is connected with the power supply terminal 3 of the active drive circuit Drn through the limiting element R1n.

Adopting the above optimization scheme, the structure is simple.

In order to further optimize the implementation effect of the present invention, in some other embodiments, the other features are the same. The difference is that the electronic switch is the MOS transistor.

In order to further optimize the implementation effect of the present invention, in some other embodiments, the other features are the same, except that the current limiting element is current limiting inductor.

It is worth that the arbitrary combination between the voltage conversion isolation diodes Din and drive signal isolation diodes D2n, through the on and off action of electronic switch K1 to complete the function of the power supply and driving pulse to the electronic switch K2 to Kn, which are considered within the scope of protection of the present invention.

Not only that, current limiting element R1n can be the current-limiting resistor or current-limiting inductor or other current limiting elements. The electronic switch can also be IGBT or MOS transistor etc. any type of electronic switch can be replaced, which is considered to be within the scope of protection of the present invention.

For optimal implementation methods of this invention, it should be pointed out that for the ordinary technical personnel in the field of on the premise of not divorced from this invention idea, can also make a number of deformation and improvements, these all belong to the scope of protection of invention.

The invention claimed is:

1. A kind of driving circuit with electronic switches in serial connection structure includes an electronic switch module and an active drive module, wherein the electronic switch module includes: electronic switch K1 to Kn, D and S terminal of n pcs electronic switches in series connection in turn, S terminal of the nth electronic switch Kn connect to D terminal of n-1 electronic switch Kn-1, where: n≥2, n is an integer;

the active drive module includes: active drive circuit Dr1 to Drn, filter capacitor C1 to Cn, current limiting element R12 to R1n, and voltage conversion isolation diodes D12 to D1n and drive signal isolation diode D22 to D2n, electronic switches are driven by corresponding active drive circuit;

the input terminal of the active drive circuit Dr1 connecting with the electronic switch K1 is connected to a pulse signal generator;

the power supply terminal of the active drive circuit Dr1 is connected with a Vcc power supply terminal;

the ground terminal of the active drive circuit Dr1 is connected with a Vcc ground terminal, the filter capacitor C1 and S terminal of the electronic switch K1 respectively;

the output terminal of the active drive circuit Dr1 is connected with the G terminal of the electronic switch K1;

the D terminal of the electronic switch K1 is connected with the S terminal of the electronic switch K2;

the input terminal of the active drive circuit Drn connecting with the electronic switch Kn is connected with the Vcc power supply terminal through the drive signal isolation diode D2n;

the power supply terminal of the active drive circuit Drn is connected with the VCC power supply terminal through the current limiting element R1n and voltage conversion isolation diode D1n, and the power supply terminal of the active drive circuit Drn is also connected with the filter capacitor Cn;

the ground terminal of the active drive circuit Drn is connected with the filter capacitor Cn, the S terminal of the electronic switch Kn and the D terminal of the electronic switch Kn-1;

the output terminal of the active drive circuit Drn is connected with the G terminal of the electronic switch Kn;

from the electronic switch K2 to Kn, the electrical energy and the driving pulse of the electronic switch K1 are obtained successively; the electronic switch K1 to the electronic switch Kn on and off in turn.

2. The driving circuit with electronic switches in serial connection structure of claim 1 is characterized by the electronic switch as IGBT or MOS transistor.

3. The driving circuit with the electronic switches in serial connection structure of claim 2 is characterized by the current limiting element is a current-limiting resistor or a current-limiting inductor.

4. The driving circuit with electronic switches in serial connection structure of claim 3 is characterized by the on pulse and the off pulse of mentioned the electronic switch K1 and the drive pulse output by pulse generator have identical frequency and phase.

5. The driving circuit with electronic switches in serial connection structure of claim 1, the driving circuit with electronic switches in serial connection structure are characterized by in the Drn of the active drive circuit connected to the electronic switch Kn;
- the positive electrode of the driving signal isolation diode D2$n$ is connected with the Vcc power supply terminal, and its negative electrode is connected with the input terminal of active drive circuit Drn, and the positive electrode of the voltage conversion isolation diode D1$n$ respectively;
- the negative electrode of the voltage conversion isolation diode D1$n$ is connected to the power terminal of the active drive circuit Drn through the current-limiting element R1$n$.

6. The driving circuit with electronic switches in serial connection structure of claim 1, the driving circuit with electronic switches in serial connection structure are characterized by, within the active drive circuit Dr2, connected with the electronic switch K2;
- the positive electrode of the driving signal isolation diode D22 is connected to the Vcc power supply terminal, and its negative electrode is connected with the input terminal of active drive circuit Dr2, and the positive electrode of the voltage conversion isolation diode D12 respectively;
- the negative electrode of the voltage conversion isolation diode D12 is connected to the power supply terminal of the active drive circuit Dr2 through the current-limiting element R12;
- within active drive circuit Drn connected with electronic switch Kn; the positive electrode of the driving signal isolation diode D2$n$ is connected with the negative electrode of the voltage conversion diode D1$n$−1, and the positive electrode of the driving signal isolation diode D2$n$ is also connected with the current-limiting element R1$n$−1; the negative electrode of the driving signal isolation diode D2$n$ is connected with the input terminal of the active drive circuit Drn and the positive electrode of voltage conversion isolation diode D1n respectively;
- the negative electrode of the voltage conversion isolation diode D1$n$ is connected to the power terminal of the active drive circuit Drn through the current-limiting element R1$n$.

7. The driving circuit with electronic switches in serial connection structure of claim 1, the driving circuit with electronic switches in serial connection structure is characterized by, within the active drive circuit Dr2 connecting with the electronic switch K2;
- the positive electrode of the driving signal isolation diode D22 is connected to the Vcc power supply terminal, and its negative terminal is connected to the input terminal of Dr2 and the positive electrode of the voltage conversion isolation diode D12 respectively;
- the negative electrode of voltage conversion isolation diode D12 is connected to the power supply terminal of the active drive circuit through the current limiting element R12;
- within the active drive circuit Drn connecting with electronic switch Kn;
- the positive electrode of the drive signal isolation diode D2$n$ is connected with the input terminal of active drive circuit Drn−1, the positive electrode of the voltage conversion isolation diode D1$n$−1 and the negative electrode of driving signal isolation diode D2$n$−1 respectively;
- the negative electrode of the driving signal isolation diode D2$n$ is connected with the input terminal of active drive circuit Drn and the positive terminal of the voltage conversion isolation diode D1$n$ respectively;
- the negative electrode of the voltage conversion isolation diode D1$n$ is connected to the power terminal of the active drive circuit Drn through the current-limiting element R1$n$.

* * * * *